US012249665B2

(12) United States Patent
Saiyan et al.

(10) Patent No.: US 12,249,665 B2
(45) Date of Patent: Mar. 11, 2025

(54) METHODS, SYSTEMS, AND APPARATUSES FOR PRODUCING, GENERATING AND UTILIZING POWER AND ENERGY

(71) Applicant: Quantum Photonics Corporation, Tyler, TX (US)

(72) Inventors: Yttrium Saiyan, Tyler, TX (US); Mary McInerny, Tyler, TX (US)

(73) Assignee: QUANTUM PHOTONICS CORPORATION, Tyler, TX (US)

( * ) Notice: Subject to any disclaimer, the term of this patent is extended or adjusted under 35 U.S.C. 154(b) by 0 days.

(21) Appl. No.: 18/168,097

(22) Filed: Feb. 13, 2023

(65) Prior Publication Data

US 2023/0197874 A1   Jun. 22, 2023

Related U.S. Application Data

(63) Continuation of application No. 17/686,520, filed on Mar. 4, 2022, now abandoned.

(60) Provisional application No. 63/157,041, filed on Mar. 5, 2021.

(51) Int. Cl.
*H01L 31/054* (2014.01)
*H01L 31/0216* (2014.01)
*H01L 31/055* (2014.01)

(52) U.S. Cl.
CPC .... *H01L 31/0547* (2014.12); *H01L 31/02167* (2013.01); *H01L 31/02168* (2013.01); *H01L 31/055* (2013.01)

(58) Field of Classification Search
CPC ............... H01L 31/055; H01L 31/0547; H01L 31/02167; H01L 31/02168; H02S 20/30; H02S 20/32
See application file for complete search history.

(56) References Cited

U.S. PATENT DOCUMENTS

| | | | | |
|---|---|---|---|---|
| 2002/0024978 A1* | 2/2002 | Inagaki | ................... | H01S 3/139 372/20 |
| 2014/0319377 A1* | 10/2014 | Morgan | ............... | G02B 6/0003 250/459.1 |

OTHER PUBLICATIONS

International Search Report and Written Opinion issued on Mar. 23, 2022, in corresponding International Application No. PCT/US2022/018873; 8 pages.

* cited by examiner

*Primary Examiner* — Lindsey A Buck
(74) *Attorney, Agent, or Firm* — Maier & Maier, PLLC

(57) ABSTRACT

According to at least one exemplary embodiment a heliostat driven reactor may be provided. The heliostat driven reactor may include one or more photonic collectors that collect photonic energy and disperses photonic energy, one or more mirrors which concentrate the photonic energy dispersed by the one or more photonic collectors, one or more gain mediums which receive, on one or more absorption faces, the photonic energy dispersed by the photonic energy collector and the photonic energy concentrated by the one or more mirrors, and/or a photoelectric material which receives photonic energy from the one or more gain mediums and converts the photonic energy into electrical energy.

3 Claims, 2 Drawing Sheets

METHODS, SYSTEMS, AND APPARATUSES FOR PRODUCING, GENERATING AND UTILIZING POWER AND ENERGY

BACKGROUND

Currently solar energy collection involving solar panels is usually accomplished by placing solar panels in an array such that the surface of the panel is orthogonal to the incident rays from the sun. Furthermore, energy generation through photonic sources is limited in its efficiency, with one of the primary limiting factors being the amount of photonic energy initially collected.

SUMMARY

According to at least one exemplary embodiment a heliostat driven reactor may be provided. The heliostat driven reactor may include one or more photonic collectors that collect photonic energy and disperses photonic energy, one or more mirrors which concentrate the photonic energy dispersed by the one or more photonic collectors, one or more gain mediums which receive, on one or more absorption faces, the photonic energy dispersed by the photonic energy collector and the photonic energy concentrated by the one or more mirrors, and/or a photoelectric material which receives photonic energy from the one or more gain mediums and converts the photonic energy into electrical energy.

BRIEF DESCRIPTION OF THE FIGURES

Advantages of embodiments of the present invention will be apparent from the following detailed description of the exemplary embodiments. The following detailed description should be considered in conjunction with the accompanying figures in which.

DETAILED DESCRIPTION

Figure 1:
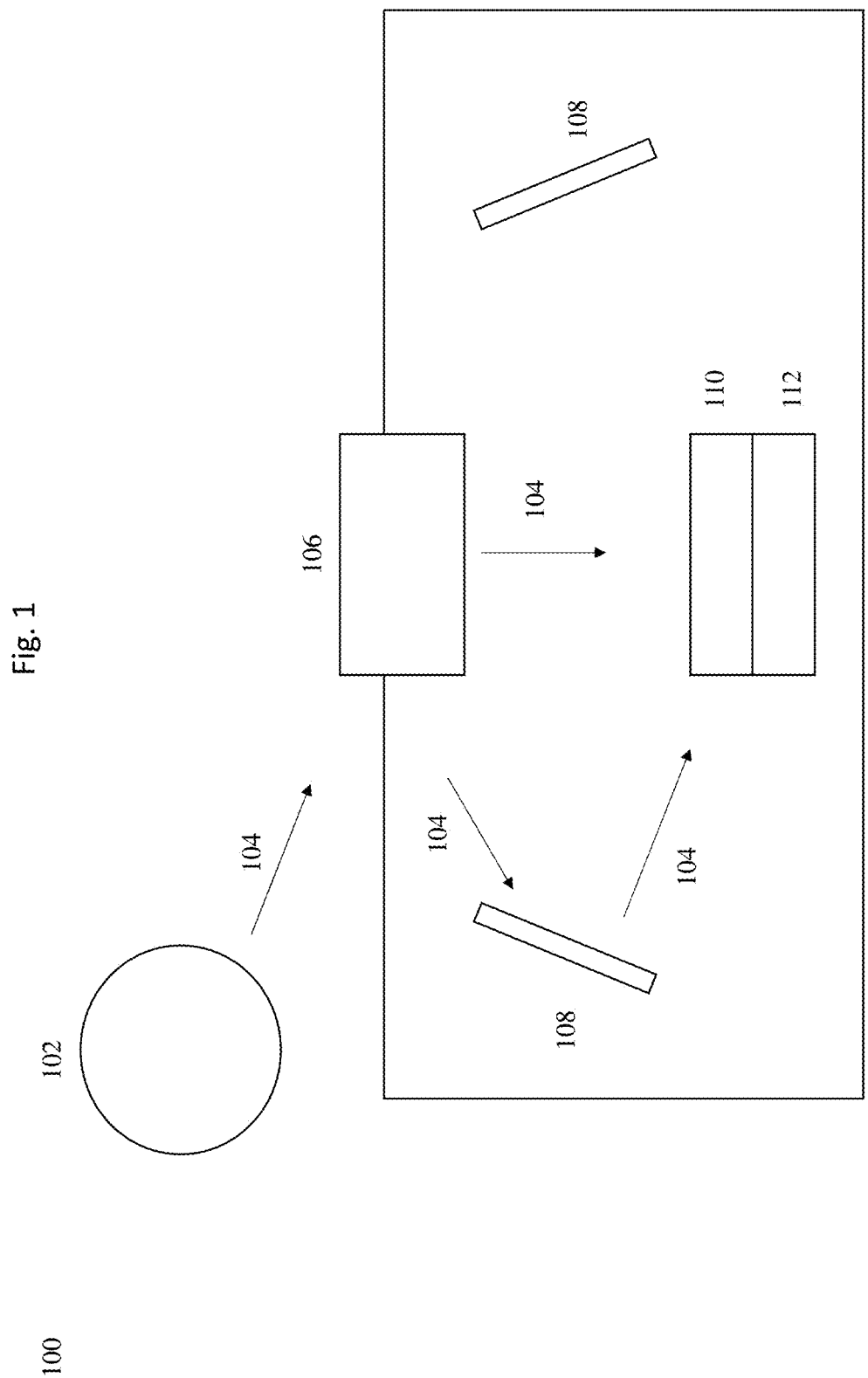
FIG. 1 shows an exemplary heliostat driven reactor.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation.

According to one or more exemplary embodiments a heliostat driven reactor 100 may be provided. The heliostat driven reactor may include a variety of different materials that allow for the conversion of photonic energy into electrical energy. The materials may include, for example, one or more of one or more photonic collectors 106, one or more mirrors 108, one or more gain mediums 110, and/or a photoelectric material 112. In an exemplary embodiment the heliostat driven reactor may concentrate solar energy and harness it as photonic energy 104. The exemplary embodiment may include an artificial photonic energy source 102 in addition to or instead of utilizing solar energy. The artificial photonic energy source 102 may emit the photonic energy 104 in a form factor that is most readily absorbable by the photonic collector 106. The photonic collector 106 may then emit the photonic energy 104 in a form factor most readily reflected by the one or more mirrors 108 and/or absorbable by the one or more gain mediums 110. The one or more gain mediums 110 may absorb the photonic energy 104, amplify it, and then emit it in a form most readily absorbable by the photoelectric material 112. The photonic energy 104 may then be converted into useable electric energy. The usable electric energy may be carbonless which may contribute to decreasing the amount of harmful fossil fuels used by traditional electrical energy generation systems.

FIG. 1 may show an exemplary heliostat driven reactor 100. The exemplary heliostat driven reactor 100 may start with a photonic energy source 102 which may release photonic energy 104. In some embodiment the photonic energy source 102 may be the sun, in other embodiments the photonic energy source 102 may be an artificial photonic energy source such as, but not limited to, an LED, an array of LEDs, a laser, or any other artificial light source that emits photonic energy 104 that may be absorbed by the photonic collector 106. The photonic energy 104 may be pulsed, emitted in a constant wave, or in any other form factor absorbable by the photonic collector 106. The photonic energy 104 may be collected by one or more photonic collectors 106. The one or more photonic collectors 106 may then disperse the photonic energy 104 within the heliostat driven reactor 100. The photonic energy may be reflected off the one or more mirrors 108 which may be arranged to concentrate the photonic energy 104 onto the one or more gain mediums 110. Some photonic energy 104 may directly reach the one or more gain medium 110 from the one or more photonic collectors 106. The one or more gain mediums 110 may be connected to, or otherwise be able to transfer energy to, the photoelectric material 112.

In different exemplary embodiments the heliostat driven reactor 100 may be constructed with different components and in different arrangements. For example, in an embodiment the heliostat driven reactor 100 may have a pyramidal structure, a cone structure, a cylinder structure, a square structure, or any other geometrical configuration that may allow for light to be reflected on the one or more mirrors 108 and/or dispersed into the one or more gain mediums 110.

In an exemplary embodiment, the heliostat driven reactor 100 may include the photonic collector 106. The photonic collector 106 may be formed from, for example, a crystalline lattice structure, which may be able to collect and concentrate the photonic energy 104 emitted from the photonic energy source 102. The crystalline lattice structure may be made of, for example but not limited to, $Al_2O_3$, $Ti^{3+}$: $Al_2O_3$, Nd: YAG, $Yb^{3+}$: YAG, Ce: YAG, or any other crystalline lattice structure that has the potential to capture and concentrate the photonic energy 104. The photonic collector 106 may also be fabricated as a concentrator lens, such as a Fresnel lens, which focuses and filters photonic energy 104 in a way that can be readily reflected by the one or more mirrors 108 or captured by the gain medium 110.

In some embodiments the photonic collector 106 may be placed at the top of the heliostat driven reactor 100, or any other location that allows for the most photonic energy 104 to be collected to be dispersed throughout the heliostat driven reactor 100. In some embodiments this may mean the location that is most receptive to receiving the photonic energy 104 emitted by the photonic energy source 102.

In an exemplary embodiment, the photonic collector 106 may have Fano-resonant optical coating (FROC) placed on the absorption face of the photonic collector 106 that simultaneously transmits and reflects light of a particular wavelength or bandgap that is most absorbable by the photonic collector 106. The optical coating may allow for the seamless collection and amplification of the photonic energy 104 to occur within the photonic collector 106. The optical coating may also be placed on the emission side of the photonic collector 106 in a way that allows for the photonic energy 104 emitted by the photonic collector 106 at a specific incident angle and wavelength most easily reflected by the mirrors 108 and/or absorbed by the gain mediums 110.

In some embodiments the photonic collector 106 may be coated in order to enhance the ability of the photonic collector 106 to emit captured concentrated photonic energy 104. The coatings may include a variety of chemical compositions that act as a filter for the photonic energy 104. In some embodiments the coating may, for example, filter out unusable wavelengths of light and/or allow for the photonic collector 106 to emit wavelengths of light that are most readily absorbed by the gain medium 110.

In some embodiments the photonic collector 106 may have a dichromatic coating. The dichromatic coating may act as a semipermeable filter for specific wavelengths of photonic energy. The wavelength selection may be based on, for example, the associated absorption band gap of the photonic collector 106. This may mean that wavelengths of light that are not within the absorption spectrum will be reflected off the surface of the photonic collector 106, while wavelengths that are within the absorption spectrum will be transmitted to the gain medium 110. The dichromatic coating may be selectively applied to the areas of the photonic collector 106 where the photonic energy 104 emitted from the photonic energy source 102 enters. In some embodiments a second dichromatic coating may be deposited on the surface of the photonic collector that emits photonic energy. The second dichromatic coating may be formed of chemicals that allow for the photonic collector to be selectively permeable to wavelengths of light that are within the photonic collector's 106 associated emission bandgap.

In some embodiments the photonic collector 106 may have an anti-reflective coating, which may be deposited on the surface of the photonic collector 106. The anti-reflective coating may allow for the photonic collector 106 to harness absorbed photonic energy 104 emitted by the photonic energy source 102. The coating may be formed from chemical compositions that are tuned to the absorption spectrum of the materials used in the photonic collector 106.

In some embodiments the photonic collector 106 may have a highly reflective coating deposited on the surface of the photonic collector 106. The coating may be tuned for the photonic collector 106 to allow for certain wavelengths of light to lace back and forth within the material. The highly reflective coating may be tuned for wavelengths of light that are within the photonic collector's 106 absorption bandgap. The highly reflective coating may prevent excess loss of the photonic energy 104 and may allow for the commencement of any associated gain potential within the photonic collector 106.

In some embodiments, the photonic collector 106 may have a polarization coating deposited on the surface of the photonic collector 106. The coating may be tuned for the photonic collector 106 to absorb photonic energy 104 at an incident angle that allows for the greatest amount of absorption to occur. The photonic collector 106 may have a polarization coating deposited on the emission side allowing photonic energy 104 to be emitted in a form factor most desirable for the absorption by the gain mediums 110 and/or reflection by the one or more mirrors 108.

In some embodiments multiple of the above coatings may be utilized, either by being applied to different areas of the photonic collector 106 or by being applied in layers to the photonic collector 106, depending on the particular application.

In some embodiments the photonic collector 106 may be a variety of different geometrical configurations that allow for photonic energy to culminate inside the collector and become focused out and either dispersed onto all absorption faces of the one or more photonic gain mediums 110, or onto the one or more mirrors 108. The geometrical structure may be, for example, a cylinder, a pyramid, or any other type of configuration that allows for the most efficient absorption and reflection of photonic energy.

In an exemplary embodiment the photonic collector 106 may be a cylindrical structure. The structure may allow for the crystalline lattice structure of the material to absorb and efficiently transmit photonic energy. For instance, a cylinder may be appropriate for certain chemical compositions that may require photonic energy to stimulate the crystalline lattice structure at a specific incident angle. This may be like the design of side-pumped laser systems that currently use this type of geometrical configuration to create a focused beam of photonic energy. In this type of configuration, side pumping the edge of the cylinder may allow for photonic energy to exit the bottom face of the structure in one coherent beam.

In another exemplary embodiment the photonic collector 106 may be a pyramidal structure, which may be applicable for certain crystalline lattice structures that require a prism in order to filter out certain wavelengths of light. In some cases, it may be necessary to use the photonic collector 106 as a filter in order to generate the most efficient bandgap of light that is most readily absorbed by the one or more gain medium's 110. Therefore, the photonic collectors 106 may absorb concentrated photonic energy 104 emitted by the photonic energy source 102 and filter out all other wavelengths that are not within the absorption bandgap of the gain mediums 110. The structure may then allow for this specific band gap of light to exit the prism and either be reflected onto the reflective mirrors 108, directly into the absorption face of the gain mediums 110, or onto any other type of reflector that allows for the gain mediums 110 to most readily absorb the culminated photonic energy 104.

In some embodiments, the photonic collector 106 may be fabricated at a specific incident angle to allow for the maximum absorption and emission of the photonic energy 104. The specific incident angle may be, for example, a Brewster angle or any other angle at which light is able to seamlessly enter and exit the material in a form factor most easily absorbed by the gain mediums 110.

In an exemplary embodiment the Heliostat Driven Reactor 100 may further include the one or more mirrors 108. The one or more mirrors 108 may be convex or concave, may be highly reflective, and/or may reflect photonic energy 104 supplied by the photonic collector 106 onto one or more absorption faces of the one or more gain mediums 110. The one or more mirrors 108 may made of, for example but not limited to, silver, aluminum, copper, gold, a combination of these materials, or any other reflective composition that readily reflects light.

In some embodiments photonic energy 104 emitted by the photonic collector 106 may be focused on the faces of the one or more mirrors 108. The one or more mirrors 108 may disperse the light into the associated one or gain mediums 110. The photonic light 104 may hit the one or more mirrors 108 at an incidence angle, which may create a reflection angle that can be tuned to stimulate the one or more absorption faces of the one or more gain mediums 110.

In some embodiments coatings may be deposited on the faces of the one or more mirrors 108 to enhance the materials ability to reflect specific wavelengths of light from the one or more photonic collectors 106 onto the absorption faces of the one or more gain mediums 110. Coatings may be tuned to be reflective towards light that is within the absorption spectrum of the one or more gain mediums 110 and may filter out other associated wavelengths that are not within this spectrum. For example, wavelengths that are within the one or more gain mediums' 110 absorption spectrum may be instantaneously reflected by the one or more mirrors 108 onto the absorption face of the one or more gain mediums 110.

In some embodiments a highly reflective coating may be applied to the one or more mirrors 108, which may act as an effective reflector for certain wavelengths of light. The wavelengths of light reflected by the highly reflective coating may be tuned to match the wavelengths of light that are within the absorption bandgap of the associated one or more gain mediums 110. This may decrease photonic energy 104 lost by reflection and may increase the available photonic energy 104 within the heliostat driven reactor 100.

In some embodiments one or more mirrors 108 may be placed within the structure that allows for light to be most readily reflected from the photonic collector 106 and focused on the absorption faces of the gain mediums 110. The mirror may be flat or curved depending upon which orientation allows for the most photonic energy to be reflected from the photonic collector 106 onto the absorption faces of the gain mediums 110.

In some embodiments the mirrors 108 may be convex. Convex mirrors 108 may allow for photonic energy to reflect off the reflective face of the mirrors 108 onto the absorption faces of the gain mediums 110. Convex mirrors 108 may be effective when dispersing photonic energy in multiple different directions. For instance, if the absorption faces of the gain mediums 110 were to be located on the inside of the structure, then the mirror would be designed to reflect light in all directions inside the structure so that photonic energy 104 may enter each of the associated faces of the gain mediums 110.

In some embodiments the mirrors 108 may be concave. Concave mirrors 108 may allow for photonic energy to be converged at a specific focal point. This may be necessary if there is/are one or more specific places where photonic energy is needed to be directed. If this is the case, then there may be a need for concave mirrors 108 that direct emitted photonic energy from the photonic collector 106 to the specified focal points. The specified focal points may include but are not limited to, the absorption face of the gain mediums 110, or on any other chemically engineered face that allows for the absorption and conversion of photonic energy into electrical energy.

It may be understood that in some embodiments both convex and concave mirrors 108 may be used, or other shapes of mirror, such as flat, may be utilized.

In an exemplary embodiment the heliostat driven reactor 100 may further include the one or more gain mediums 110. The one or more gain mediums 110 may have a crystalline lattice structure that has the potential to readily capture photonic energy 104. The crystalline lattice structure may include a variety of different chemical compositions that may capture and/or amplify photonic energy 104. The chemicals compositions may include, but are not limited to, $Ti^{3+}: Al_2O_3$, $Nd: YAG$, $Yb^{3+}: YAG$, $Ce: YAG$, or any other crystalline lattice structure that has the potential to capture and/or amplify photonic energy. The one or more gain mediums 110 may be designed to readily capture the photonic energy 104 supplied by the photonic collector 106. Once the energy is captured, the one or more gain mediums 110 may include additional components that for the photonic energy 104 to be captured within the one or more gain mediums 110.

In some embodiments coatings may be deposited on the faces of the one or more gain mediums 110 to enhance the materials ability to absorb, harness, and emit certain wavelengths of light. The coatings may be tuned to the absorption and emission spectrum of the associated one or more gain mediums 110. The coatings may be designed to direct certain wavelengths of photonic energy 104 into the material, while simultaneously allowing for certain wavelengths to exit the material. Wavelengths that are within the one or more gain mediums' 110 peak absorption spectrum may be readily transmitted into the material, while wavelengths that are within the one or more gain mediums' 110 peak emission spectrum may be allowed to exit the material.

In an exemplary embodiment, the one or more gain mediums 110 may have Fano-resonant optical coating (FROC) placed on the absorption face that simultaneously transmits and reflects light of a particular incident angle and/or wavelength or bandgap that is most absorbable by the gain mediums 110. The optical coating may allow for the seamless collection and amplification of photonic energy 104 to occur within the gain mediums 110. Amplification of photonic energy 104 may occur within the gain mediums 110 by the ability of the optical coating to transmit, capture, and lace photonic energy 104 back and forth within the material at a specific bandgap most reactive for the gain mediums 110. The FROC coating may also be placed on the emission side of the gain media 110 in a way that allows for the amplified photonic energy emitted by the gain media 110 at a specific incident angle and/or band gap most easily absorbed by the photoelectric materials 112.

In some embodiments the one or more gain mediums 110 coating may be a dichromatic coating. The gain medium dichromatic coating may include a variety of different chemical compositions and may act as a semipermeable filter for specific wavelengths of photonic energy. The selection of wavelengths may be based upon the associated absorption band gap of the one or more gain mediums 110. Wavelengths of light not within the absorption spectrum may therefore be reflected off the surface of the one or more gain mediums 110, while wavelengths within the absorption spectrum of the one or more gain mediums 110 may be transmitted into the material. The gain medium dichromatic coating may be placed on the surface of the one or more gain mediums 110 that are facing the photonic energy 104 emitted by the photonic collector 106 and/or the one or more mirrors 108.

In some embodiments the one or more gain mediums 110 coating may be an anti-reflective coating. The anti-reflective gain medium coating may allow for the one or more gain mediums 110 to harness the photonic energy 104 that may be emitted by the photonic collector 106. The coating may be formed of a variety of different chemical compositions that are specifically tuned to the absorption spectrum of the materials used in the one or more gain mediums 110.

In some embodiments the one or more gain mediums 110 coating may be a highly reflective coating. The highly reflective gain medium coating may be specially tuned for the one or more gain mediums 110 allowing for certain wavelengths of light to lace back and forth within the material. The highly reflective gain medium coating may be tuned for wavelengths of light that are within the photonic collector's 106 absorption bandgap, which may prevent excess loss of absorbed photonic energy 104 and/or may allow for the commencement of any associated photonic gain potential within the one or more gain mediums 110.

In some embodiments, the one or more gain mediums 110 may have a polarization coating deposited on the absorption face. The coating may be tuned for the gain mediums 110 to absorb photonic energy 104 at an incident angle that allows for the greatest amount of absorption to occur within the material. The one or more gain mediums 110 may have a polarization coating deposited on the emission side allowing photonic energy 104 to be emitted in a form factor most desirable for the absorption by the photoelectric material 112.

In some embodiments multiple of the above coatings may be utilized, either by being applied to different areas of the photonic collector 106 or by being applied in layers to the photonic collector 106, depending on the particular application.

In some exemplary embodiments the structure of the gain mediums 110 may vary depending on the crystalline lattice structure of the material they are constructed from. For instance, in some embodiments the gain mediums 110 may be rectangular, cylindrical, pyramidal, or any other geometrical configuration that allows for the absorption and emission of photonic energy within the materials crystalline lattice structure.

In some embodiments the gain mediums 110 may include one or more faces. One or more of the one or may faces may be referred to as absorption faces, which may be faces positioned in a location that allows for the absorption of the photonic energy 104 emitted by the photonic collector 106. This absorption face may require fabrication to allow for the most seamless transition of the photonic energy 104 into the gain mediums 110.

In some embodiments it may be necessary for one or more sides of the gain mediums 110 to undergo polarization. Polarization may decrease the amount of reflection losses and allow for seamless entrance of the photonic energy 104 into the gain mediums 110. This may also be known as a Brewster angle. For instance, to increase the amount of photonic energy that is absorbed into the material, the structure may include one or more faces that are cut at a particular incident angle. This specific incident angle may allow for photonic energy of a specific bandgap to readily enter the gain mediums 110. When the photonic energy 104 can readily enter the material with minimal losses, there may be more available photonic energy to stimulate any gain potential the material may possess.

One or more of the non-absorption faces may be an emission face. The emission face may be where the photonic energy 104 is most readily emitted by gain mediums 110. The photonic energy 104 may have already been absorbed by the gain mediums 110 and may have undergone a specific reaction that has altered the wavelength of the photonic energy 104. The photonic energy emitted by the gain mediums 110 at an alternative wavelength may exit the emission face of the gain mediums 110.

In an exemplary embodiment the heliostat driven reactor 100 may further include the photoelectric material 112. The photoelectric material 112 may be a semiconducting material that may be able to convert photonic energy into electrical energy through, for example, the photoelectric effect. The semiconducting material may be, for example but not limited to, one or more of GaAs, InGaN, InP, crystallin silicon, or any other chemical composition that has photoelectric capabilities.

In an exemplary embodiment the photoelectric material 112 may have a reflective coating that increases the captured photonic energy 104 by limiting the amount of photonic energy that can exit the photoelectric material 112. The reflective coating may be formed of, for example, one or more of copper, silver, gold, or any other chemical composition that has high reflective properties. By limiting the amount of photonic energy that exits the photoelectric material 112, potential to generate electrical energy may be increased as the amount of photonic energy available for a sustained reaction in increased.

In an exemplary embodiment the photoelectric material 112 may further include highly conductive chemical components that allow for excited electrons to travel from the photoelectric material to one or more associated circuits. The conductive material may be, for example but not limited to, one or more of copper, nickel, aluminum, or any other chemical composition that has low resistance and highly conductive properties.

In an exemplary embodiment the circuitry may be configured in a way that regulates the onloading and offloading of electrons within the photoelectric material 112. These regulations may be tuned for the form factor of photonic energy 104 emitted by the one or more gain mediums 110 in a way that allows for the greatest amount of photonic energy 104 to be efficiently converted into electrical energy.

In some embodiments coatings may be deposited on the surface of the photoelectric material 112 to allow for, for example, seamless transmission of the photonic energy 104 from the associated one or more gain mediums into the photoelectric material 112. The photoelectric material coatings may be designed to accommodate any difference in the refractive index between the different materials in the heliostat driven reactor 100.

In some embodiments the photoelectric material 112 coating may be an index matching coating. The photoelectric material index matching coating may allow for the one or more gain medium's 110 emitted photonic energy 104 to readily enter the photoelectric material 112 with the reduced resistance. The photoelectric material index matching coating may be specially tuned for the emission spectrum of the one or more gain medium's 110 and may allow for the photonic energy 104 to be focused on the face of the photoelectric material 112 that most readily absorbs the photonic energy 104. By allowing this seamless transmission, the amount of photonic energy that is lost may be significantly decreased allowing for more photonic energy to be used for conversion into electrical energy. In some embodiments the photoelectric material index matching coating may be an antireflective, dichromatic, or any other type of coating that increases the materials ability to transmit light within its peak absorption spectrum, while minimizing reflection losses.

In some embodiments the photoelectric material coating may be a highly reflective coating. The photoelectric material highly reflective coating may be placed on a side of the photoelectric material 112 that is not adhered to the one or more gain medium's 110. The photoelectric material highly reflective coating may decrease the total amount of photonic energy 104 that is lost and not absorbed by the photoelectric material 112. The photoelectric material 112 highly reflective coating may include copper, aluminum, silver, gold, or any other chemical composition that has highly reflective properties. By decreasing the total amount of lost photonic energy, the photonic energy 104 available within the photoelectric material 112 that may be converted into useable electrical energy may be increased.

In some embodiments the photoelectric material 112 may be in a particular location that allows for the absorption of photonic energy from the emission face of the gain medium in order to absorb as much photonic energy as possible. In some embodiments the photoelectric material 112 may be fabricated and oriented on the emission face of the gain medium in a way that allows for seamless transition from the two materials with minimal reflection losses. The photoelectric material 112 may have at least two faces, one or more faces that are placed on the emission face of the gain mediums 110 may have a specialized coating that allows for the seamless transition of photonic energy from the gain mediums 110 into the photoelectric material 112.

One or more other faces of the photoelectric material 112 may be highly reflective and/or have a highly reflective coating. The highly reflective faces of the photoelectric material 112 may increase the amount of absorbed photonic energy and increase the amount of usable energy within the heliostat driven reactor 100.

In some embodiments one or more of the photonic collector 106, mirrors 108, gain mediums 110, and/or photoelectric material 112 may be contained within a casing. In other embodiments these components may be within multiple casings and/or some or all may be in the open.

Figure 2:
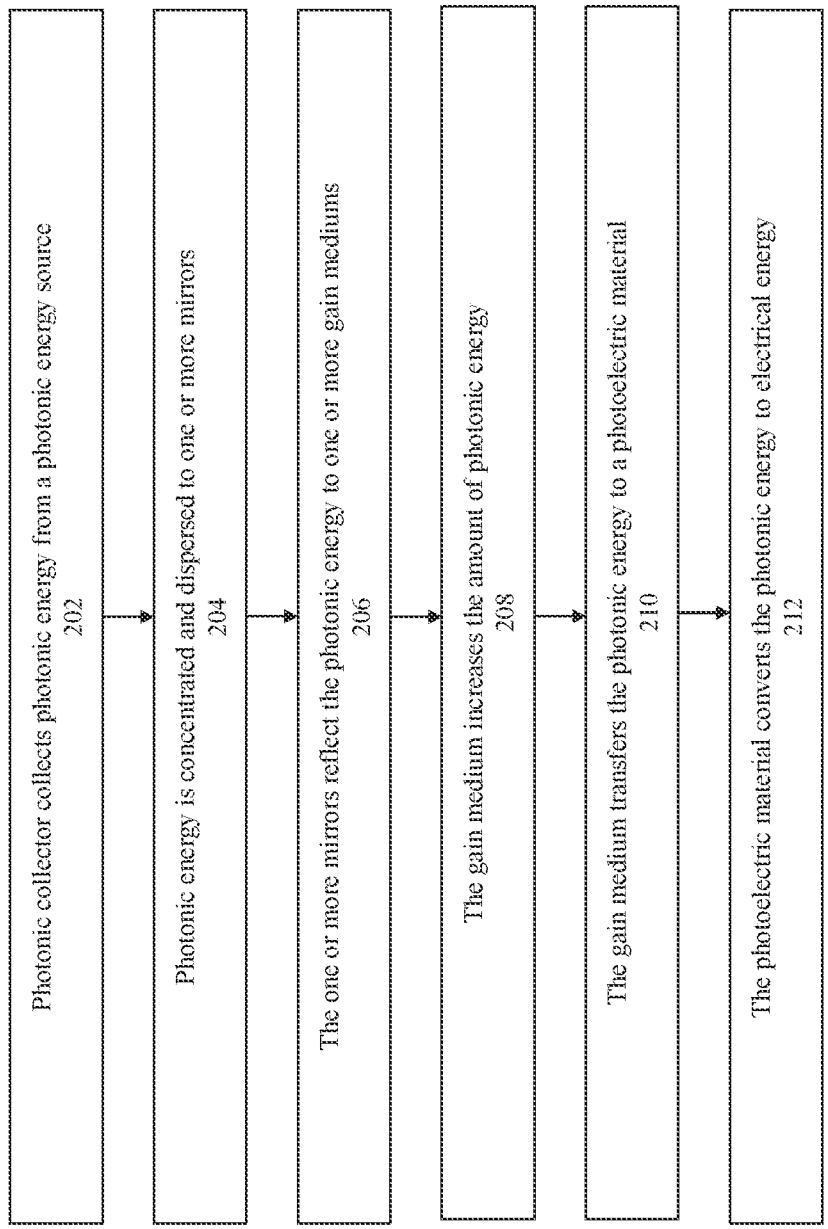
FIG. 2 shows an exemplary method for generating energy through the heliostat driven reactor.

FIG. 2 may show an exemplary method for generating energy through the heliostat driven reactor 200. In a first step 202 the photonic collector 106 may collect the photonic energy 104 being emitted by the photonic energy source 102. In a next step 204 the photonic energy 104 may be concentrated within the photonic collector 106 and/or be dispersed throughout the heliostat driven reactor 100. In a third step 206 the one or more mirrors 108 may reflect the photonic energy 104 being dispersed by the photonic collector 106 so that the photonic energy 104 is concentrated on the absorption faces of one or more gain mediums 110. In a fourth step 208 the photonic energy may increase a gain within the one or more gain mediums 110, for example through chemical reaction or reflection off the crystalline structure of the one or more gain mediums 110. The gain may further be increased by the use of various coatings as described above. In a fifth step 210 the one or more gain mediums 110 may transfer the photonic energy 104 to the photoelectric material 112, in some embodiments this may be direct transmission through contact, indirect transmission through emission, or through any other method known in the art. In a final step 212 the photoelectric material 112 may convert the received photonic energy 104 into electrical energy.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A reactor, comprising:
    one or more photonic collectors that collect photonic energy and disperse photonic energy;
    one or more mirrors which concentrate the photonic energy dispersed by the one or more photonic collectors;
    one or more gain mediums which receive, on one or more absorption faces, the photonic energy dispersed by the one or more photonic collectors and the photonic energy concentrated by the one or more mirrors;
    a photoelectric material which receives photonic energy from the one or more gain mediums and converts the photonic energy into electrical energy,
    wherein each of the one or more gain mediums are coated with a first reflective coating,
    wherein the one or more photonic collectors are coated with a second reflective coating that is tuned to allow for certain wavelengths of light to lace back and forth within each of the one or more photonic collectors;
    wherein the one or more photonic collectors comprise cylinders and/or pyramids;
    wherein the photoelectric material is coated with an index matching coating; and
    wherein the one or more gain mediums have a crystalline structure selected from the group consisting of $Ti^{3+}$: $Al_2O_3$, $Yb^{3+}$: YAG, and Ce: YAG, and a Fano-resonant optical coating (FROC) on the one or more absorption faces of each of the one or more gain mediums, the FROC is configured such that the photonic energy laces back and forth within the one or more gain mediums to produce a photonic energy gain.

2. The reactor of claim 1, wherein the one or more mirrors are made out of at least one of silver, aluminum, copper, or gold.

3. The reactor of claim 1, wherein the second reflective coating is tuned for wavelengths of light within an absorption bandgap of the one or more photonic collectors.

* * * * *